(12) United States Patent
Yamaguchi

(10) Patent No.: US 6,788,431 B1
(45) Date of Patent: *Sep. 7, 2004

(54) IMAGE PROCESSING METHOD AND IMAGE READING METHOD

(75) Inventor: Hiroshi Yamaguchi, Kanagawa (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1147 days.

(21) Appl. No.: 09/072,553

(22) Filed: May 5, 1998

(30) Foreign Application Priority Data

May 8, 1997 (JP) .............................................. 9-118492

(51) Int. Cl.[7] .......................... G06F 15/00; H04N 1/46; G03F 3/08
(52) U.S. Cl. ........................ 358/1.9; 358/504; 358/518
(58) Field of Search ................................ 358/504, 519, 358/518, 521, 520, 523, 524, 526, 527, 1.9, 1.1, 1.4; 382/162, 165, 167

(56) References Cited

U.S. PATENT DOCUMENTS

| 4,274,732 | A | * | 6/1981 | Thurn et al. .................. 355/38 |
| 5,124,742 | A | * | 6/1992 | Yoshikawa .................... 355/27 |
| 5,321,520 | A | * | 6/1994 | Inga et al. ................... 358/403 |
| 5,344,730 | A | * | 9/1994 | Kitamoto ....................... 430/14 |
| 5,467,168 | A | * | 11/1995 | Kinjo et al. ................... 355/77 |
| 5,483,259 | A | * | 1/1996 | Sachs .......................... 345/153 |
| 5,696,576 | A | * | 12/1997 | Itoh et al. ...................... 355/40 |
| 5,731,884 | A | * | 3/1998 | Inoue .......................... 358/456 |
| 5,768,642 | A | * | 6/1998 | Sugiyama et al. ........... 396/319 |

FOREIGN PATENT DOCUMENTS

| JP | 7-15593 | 1/1995 | ............ H04N/1/17 |
| JP | 9-304906 | 11/1997 | .......... G03D/13/00 |

* cited by examiner

*Primary Examiner*—Madeleine Nguyen
(74) *Attorney, Agent, or Firm*—Sughrue Mion, PLLC

(57) ABSTRACT

A patch image for calibration information is printed and exposed onto a film in advance and the image is formed in the same way as a frame image by heat development processing. In a case in which an image data input to a data sorting portion is determined to be a patch image, the data is transmitted from the data sorting portion to a correction value operating portion and a curve (γ curve) of exposure to be referenced and a γ curve based on the read patch image are compared. Then, correction is operated and the corrected value is transmitted to a data converting portion. The image data of each frame is corrected in accordance with the correction value.

20 Claims, 7 Drawing Sheets

F I G. 4
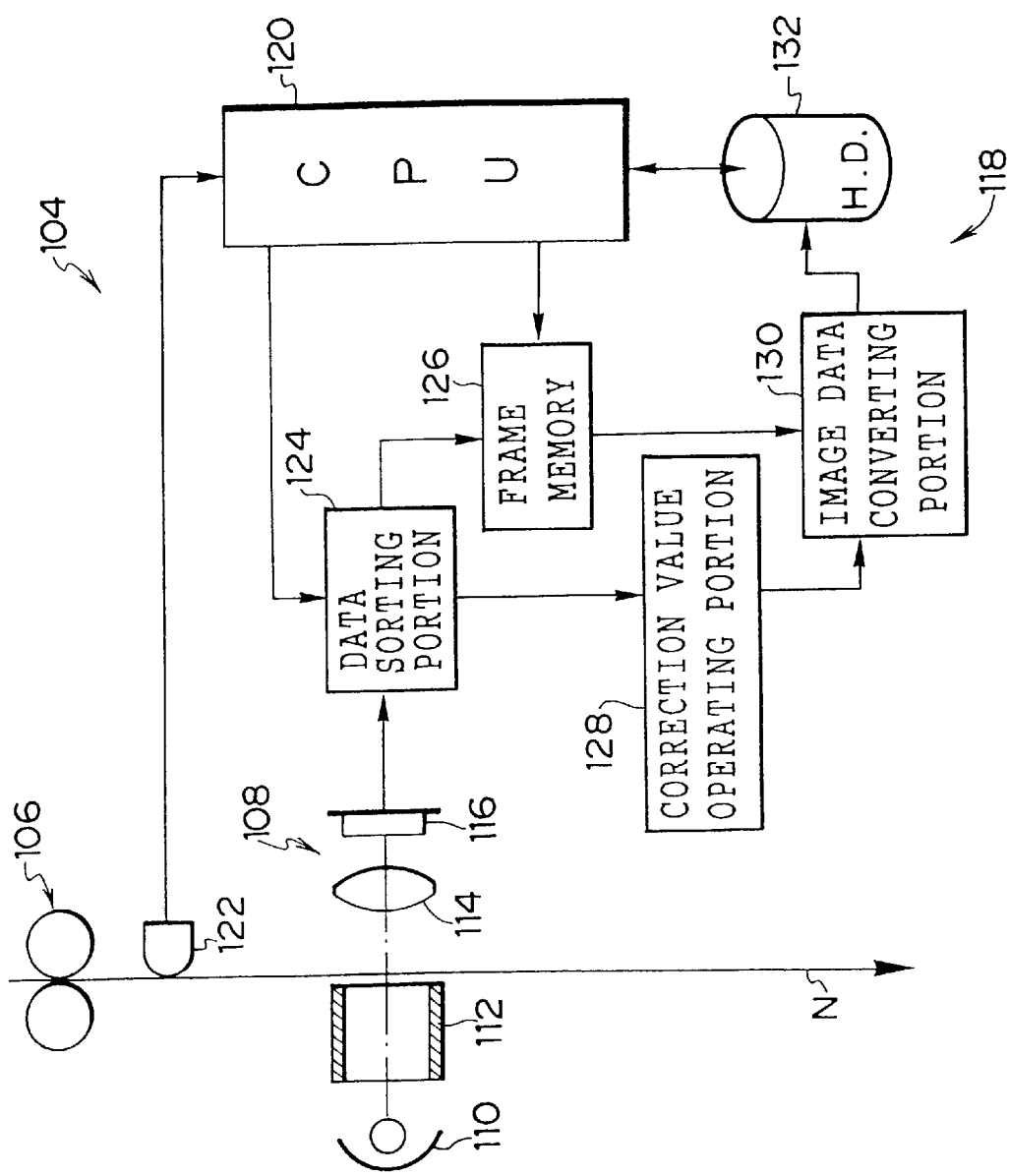

F I G. 6
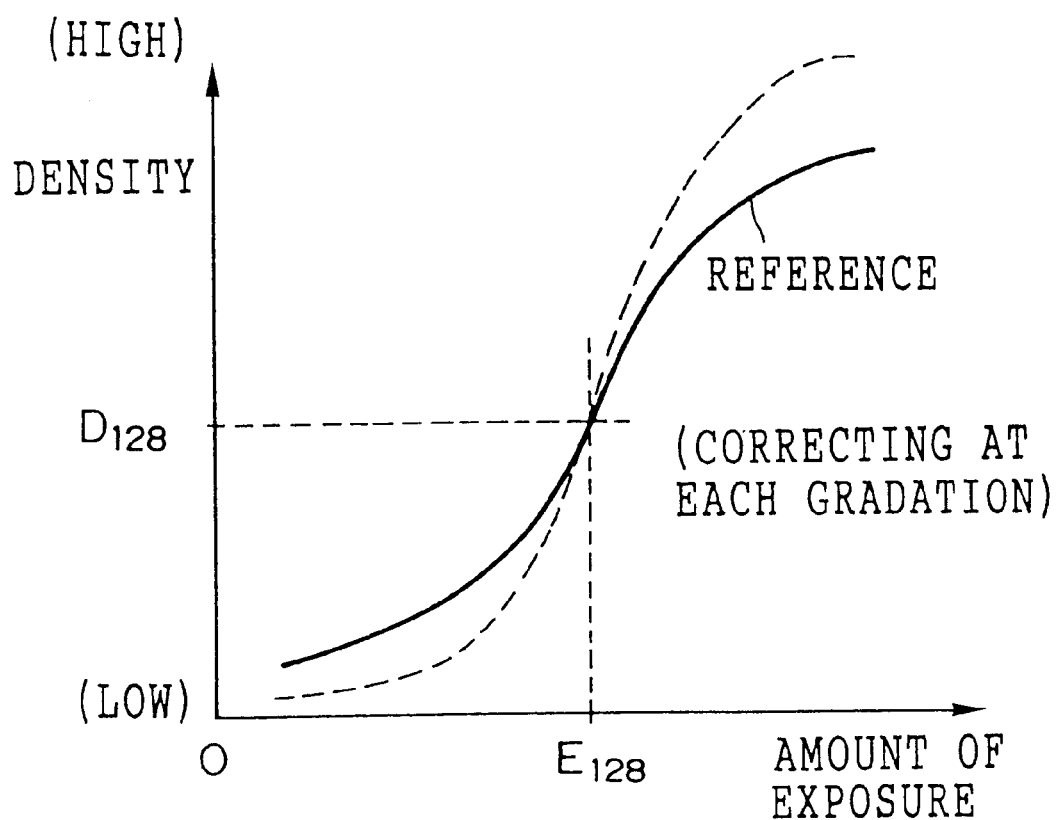

IMAGE PROCESSING METHOD AND IMAGE READING METHOD

BACKGROUND OF THE INVENTION

1. Field of the Invention

The present invention relates to an image processing method and an image reading method in which an image exposed onto a photosensitive material for photographing is read digitally, and on the basis of the read digital image, an image is processed.

2. Description of the Related Art

In recent years, a method has been known in which an image formed on a color negative film serving as a photosensitive material for photographing is read photoelectrically and is then subjected to image processing so as to form image data for recording, so that an image is obtained on another image recording material using this image data. In particular, a digital printer is advanced in which the above-described image data serves as a digital signal, a photosensitive material such as a color paper or the like is scan-exposed by laser light modulated in accordance with the digital signal, and a finished print is formed. An example of the digital printer is described in Japanese Patent Application Laid-Open (JP-A) No. 7-15593.

Here, it is assumed that the photographed color negative film is subjected to ordinary developing, bleaching, and fixing processings (wet processing) so as to form an image, and that thus the image forming process is complicated.

As a result, the present applicants propose an apparatus for forming an image on a heat development photosensitive material by heating the heat development photosensitive material in a state in which the photosensitive material and a processing member (containing mordant) are laminated (e.g., Japanese Patent Application Laid-Open (JP-A) No. 9-304906).

According to the proposal, an image can be formed on a heat development photosensitive material, onto which an image has been exposed, by a simple method without effecting on complicated developing, bleaching, and fixing processings carried out in the conventional method. Because liquid which contains agent such as a processing solution or the like is not used, the maintenance performance of the machine can be improved.

However, when the image is read under the same conditions regardless of the type of color negative film, the color density is different and optimal digital image data cannot be obtained. As a result, complicated calibration must be carried out for each color negative film. There is a drawback in that it takes an enormous amount of time to read the image and that work efficiency is lowered.

SUMMARY OF THE INVENTION

With the aforementioned in view, an object of the present invention is to obtain an image processing method and an image reading method in which, when images are read under the same conditions for each photosensitive material for photographing, digital image data which is suitable for each of the photosensitive materials for photographing can be obtained by a simple calibration processing.

A first aspect of the present invention is an image processing method, comprising the steps of: exposing a calibration pattern outside the image exposure area of a photosensitive material for photographing before or after the image is exposed onto the photosensitive material for photographing; digitally reading the formed image and the calibration pattern after development processing and creating digital image data and digital calibration pattern data; and on the basis of the created digital calibration pattern data, correcting the digital image data.

In accordance with the first aspect of the present invention, the calibration pattern is exposed beforehand onto the photosensitive material for photographing. The exposure area is outside the image exposure area at the time of photographing.

In this way, when the photosensitive material for photographing, onto which the calibration information has been exposed, is subjected to development processing, the calibration pattern serving as the calibration information is processed together with the photographic image.

After the development processing, the formed photographic image and the formed image based on the calibration pattern are read digitally.

Next, the digital image data of the read photographic image is corrected on the basis of the digitized digital calibration pattern data.

Due to the correction, when the digital image data is used and subjected to print/exposure on a photographic printing paper or the like after the correction, the optical system such as a light source can be standardized.

A second aspect of the present invention is an image processing method, comprising the steps of: exposing a calibration pattern outside the image exposure area of a photosensitive material for photographing before or after the image is exposed onto the photosensitive material for photographing; digitally reading the formed image and the calibration pattern after development processing and creating digital image data and digital calibration pattern data; converting the created digital calibration pattern data into data which does not depend on the characteristics of the photosensitive material for photographing; and on the basis of the converted data, correcting the digital image data.

In a third aspect of the present invention, the data which does not depend on the characteristics of the photosensitive material for photographing is the amount of exposure during photographing.

In accordance with the second aspect of the present invention, the calibration pattern is exposed based on the characteristic of the standard amount of exposure/density. Consequently, when there is a difference between the data to be referenced and the digital calibration pattern data which is read after development, the difference is caused by the characteristic of the photosensitive material for photographing. In order to remove the difference, the pattern is converted into data which does not depend on the characteristics of the photosensitive material for photographing, and thereafter, the image data is corrected. In this way, more accurate correction which does not depend on the photosensitive material for photographing can be made.

As described in the third aspect of the present invention, the amount of exposure during photographing is suitable as data which does not depend on the characteristic of the photosensitive material for photographing.

In a fourth aspect of the present invention, when the difference between the characteristic of the amount of exposure/density of the photosensitive material for photographing to be applied and the characteristic of the amount of exposure/density to be referenced is only a constant which does not affect the inclination of the characteristics, a predetermined single gradation of at least one of gray and the respective colors R, G, B is exposed.

In accordance with the fourth aspect of the present invention, when the difference between the characteristic of the amount of exposure/density of the photosensitive material for photographing to be applied and the characteristic of the amount of exposure/density to be referenced is only a constant which does not affect the inclination of the characteristics, a predetermined single gradation of gray or the respective colors R, G, B is exposed as the calibration pattern. Because only the characteristic curve of the photosensitive material for photographing is shifted with respect to the characteristic curve to be referenced, only one dot of the predetermined gradation of gray or the respective colors R, G, B may be exposed. For example, if gray (halftone) is used, a determination is made as to how far the formed image deviates from gray, and the amount of deviation is operated. The result of the operation is reflected in the digital image data. In this way, even if the types of photosensitive materials for photographing are different, the digital image data to be referenced is formed ultimately. Thereafter, when the digital image data is used and subjected to print/exposure onto a photographic printing paper or the like, an optical system such as a light source or the like can be standardized.

In a fifth aspect of the present invention, when the difference between the characteristic of the amount of exposure/density of the photosensitive material for photographing to be applied and the characteristic of the amount of exposure/density to be referenced is a coefficient which affects the inclination of the characteristics, a predetermined plurality of gradations of gray or respective colors R, G, B or a predetermined range of continuous gradations of gray or respective colors R, G, B is exposed.

In accordance with the fifth aspect of the present invention, when the difference between the characteristic of the amount of exposure/density of the photosensitive material for photographing to be applied and the characteristic of the amount of exposure/density to be referenced is a coefficient which affects the inclination of the characteristics, a predetermined plurality of gradations of gray or respective colors R, G, B or a predetermined range of continuous gradations of gray or respective colors R, G, B is exposed. In this case, the larger the number of the exposed gradations, the better the accuracy, however, the longer the processing time. The most optimal number of gradations is selected so as to keep the balance between the accuracy and the processing time. For example, in an area which does not depend on the amount of exposure of the photosensitive material for photographing (a portion having a flat inclination), the number of gradations within the area may be reduced and a correction coefficient may be selected so as to form a linear area.

In a sixth aspect of the present invention, if which it cannot be determined as to whether the difference between the characteristic of the amount of exposure/density of the photosensitive material for photographing to be applied and the characteristic of the amount of exposure/density to be referenced is a coefficient which does affect the inclination of the characteristics or a constant which does not affect the inclination thereof, a predetermined plurality of gradations of an arbitrary color or a predetermined range of continuous gradations of an arbitrary color is exposed.

In accordance with the sixth aspect of the present invention, if it cannot be determined as to whether the difference between the characteristic of the amount of exposure/density of the photosensitive material for photographing to be applied and the characteristic of the amount of exposure/density to be referenced is a constant which does not affect the inclination of the characteristics or a coefficient which does affect the inclination of the characteristics, the converted data may be memorized in a lookup table or the like as non-linear data.

A seventh aspect of the present invention is an image reading method, comprising the steps of: exposing a calibration pattern outside the image exposure area of a photosensitive material for photographing before or after the image is exposed onto the photosensitive material for photographing; digitally reading the formed image and the calibration pattern after development processing and creating digital image data and digital calibration pattern data; and adding the calibration pattern to the digital image data so as to be output.

In accordance with the seventh aspect of the present invention, because the image data is corrected ultimately in the above-described first through sixth aspects, the formed print image is only the image which has been corrected.

In an eighth aspect of the present invention, if the photosensitive material for photographing is taken up in a roll form and accommodated within a predetermined cartridge, the exposure area of the calibration pattern of the photosensitive material for photographing is provided at an end portion which is close to the cartridge core.

Namely, it is preferable if the photosensitive material for photographing is a photographic film which is taken up in a layer form in a cartridge or the like, since the exposure area is provided at the trailing end portion thereof which is less likely to be exposed.

In a ninth aspect of the present invention, the calibration pattern is selected from a plurality of calibration patterns stored in advance by reading an identification marking (a bar code or the like) which specifies the photosensitive material for photographing.

Further, for example, in the case of an APS (advanced photo system)photographic film, since the information which specifies the photographic film is recorded onto a magnetic recording layer, this magnetic information may be read.

In a tenth aspect of the present invention, when the predetermined range of continuous gradations is exposed, the density is continuously changed by using a light source which can be modulated.

In an eleventh aspect of the present invention, when the correction coefficient of the digital image data is set for a plurality of areas, the area, in which the characteristic of the amount of exposure/density of the photosensitive material for photographing to be applied does not depend on the amount of exposure of the photosensitive material for photographing, is set wide and the area, in which the characteristic does depend on the amount of exposure of the photosensitive material for photographing, is set narrow.

In a twelfth aspect of the present invention, when the correction coefficient of the digital image data is set for a plurality of areas, the when the characteristic of the amount of exposure/density of the photosensitive material for photographing to be applied is non-linear, an area is set with predetermined restriction.

In a thirteenth aspect of the present invention, the formed image data and the corrected image data are separately recorded onto an exterior recording medium.

In accordance with the thirteenth aspect of the present invention, in recent years, image processing can be easily effected individually by a personal computer. In order to cope with this, the image data and the corrected data can be delivered to a customer as they are.

As a result, the customer can individually effect desirable image processing and print images by using the image data and the corrected data which they have received.

BRIEF DESCRIPTION OF THE DRAWINGS

FIG. 4 is a block diagram which shows the inner portion of an image reading device.

FIG. 6 is a characteristic view of the amount of exposure/density for obtaining a correction value by a gradation image of gray.

DESCRIPTION OF THE PREFERRED EMBODIMENTS

Figure 1:
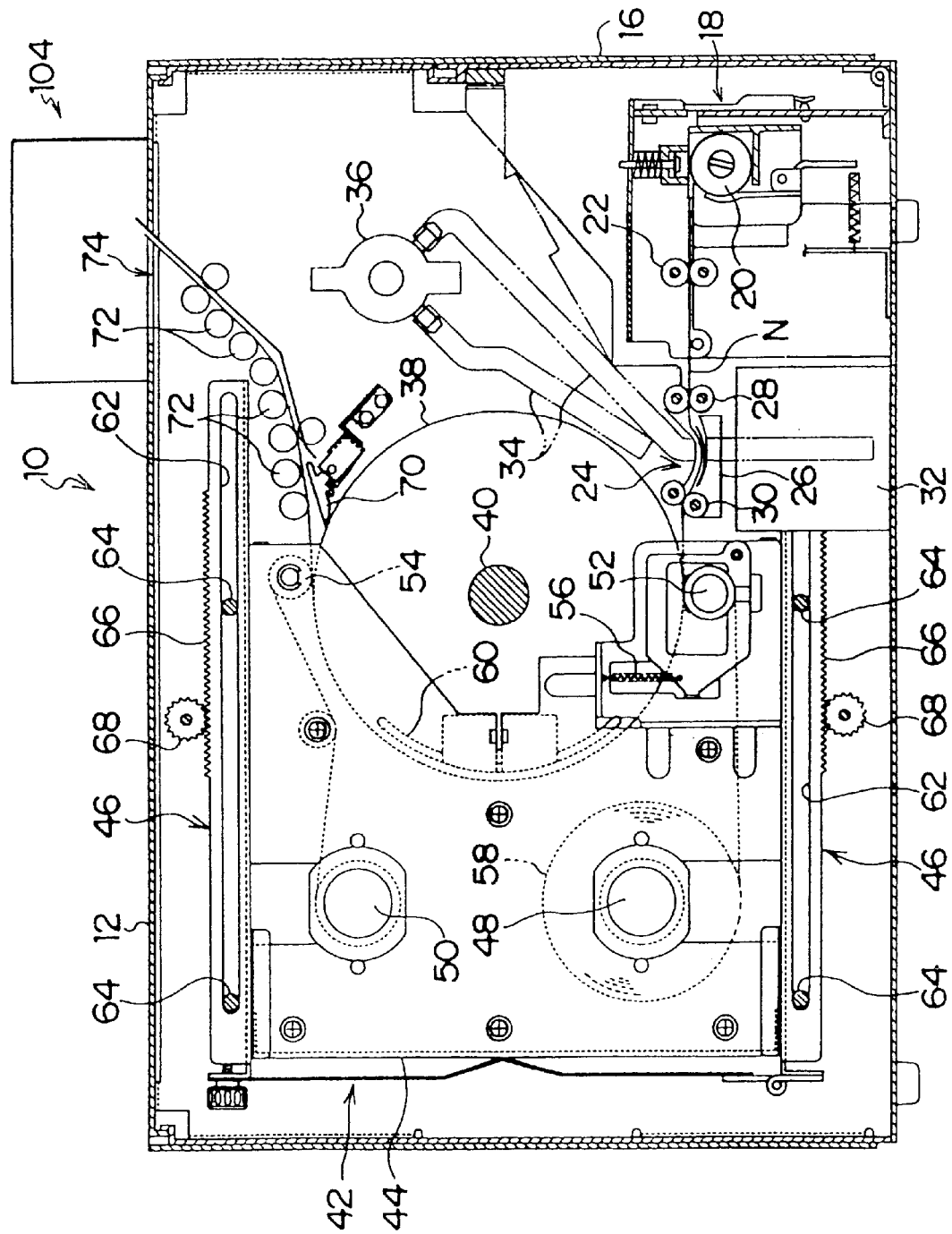
FIG. 1 is an overall structural view of a photosensitive material processing apparatus relating to an embodiment of the present invention.
Figure 2:
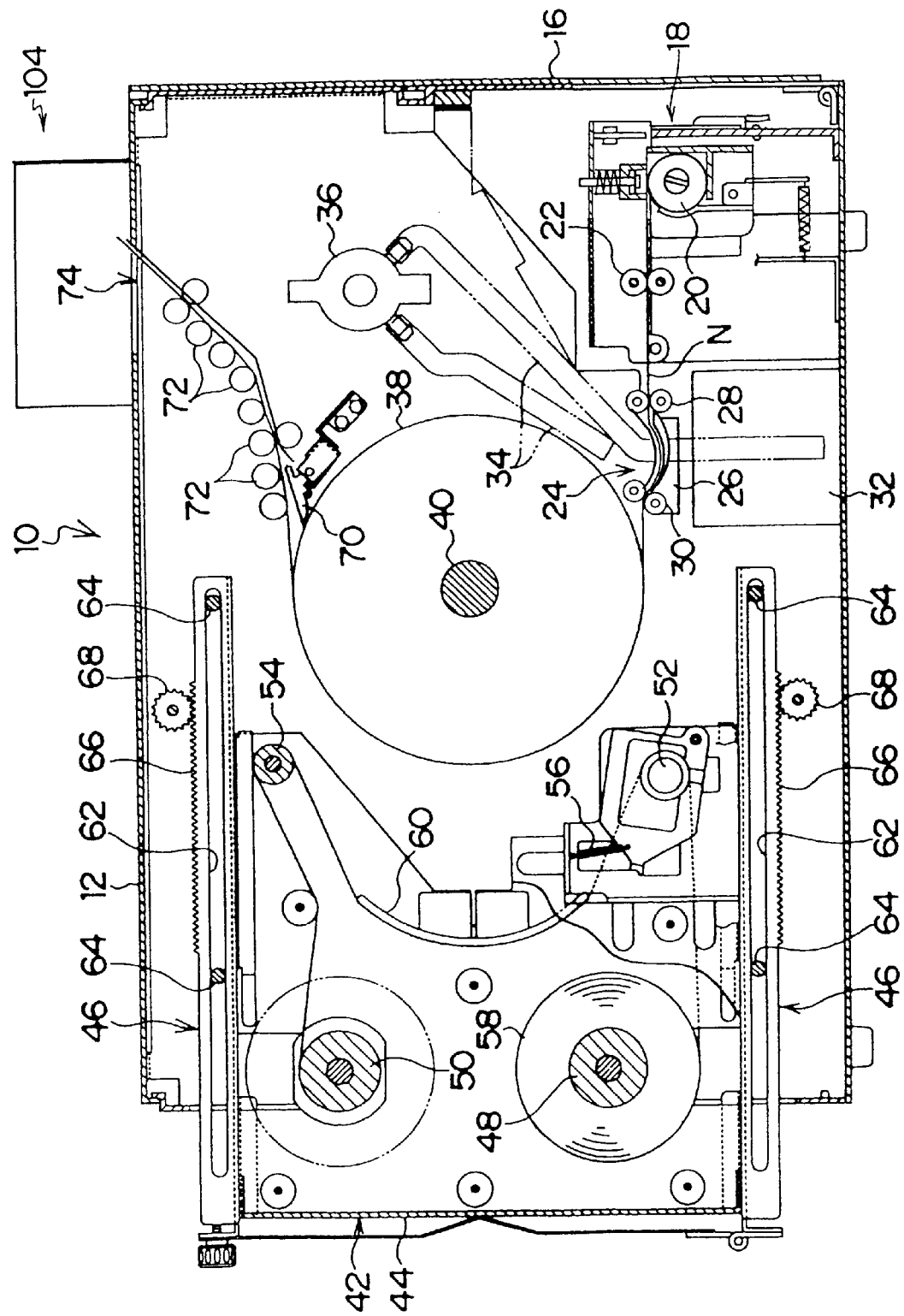
FIG. 2 shows the overall structure of the photosensitive material processing apparatus relating to the embodiment of the present invention and is a structural view thereof in a state in which a processing member cassette is separated from a heating drum.

FIGS. 1 and 2 show a perspective view of a photosensitive material processing apparatus 10 relating to an embodiment of the present invention.

A main body 12 of the photosensitive material processing apparatus 10 is formed box-shaped. A cartridge loading portion 18 is provided at the lower right corner portion of the main body 12. A cartridge 20, which accommodates a photographed film N, can be loaded into the cartridge loading portion 18. Further, a conveying roller pair 22 is disposed in the vicinity of the cartridge loading portion 18 in such a way that the film N can be withdrawn and conveyed from the loaded cartridge 20.

The film N in the present embodiment corresponds to a heat development photosensitive material containing a color material of the present invention, and includes, on a substrate, at least a photosensitive silver halide, a binder, and a color material which has a function of discharging or diffusing a diffusible dye imagewisely. The film N has at least three types of photosensitive layers whose photosensitive wavelength areas and hues after the color material is developed are different from each other.

Figure 3:
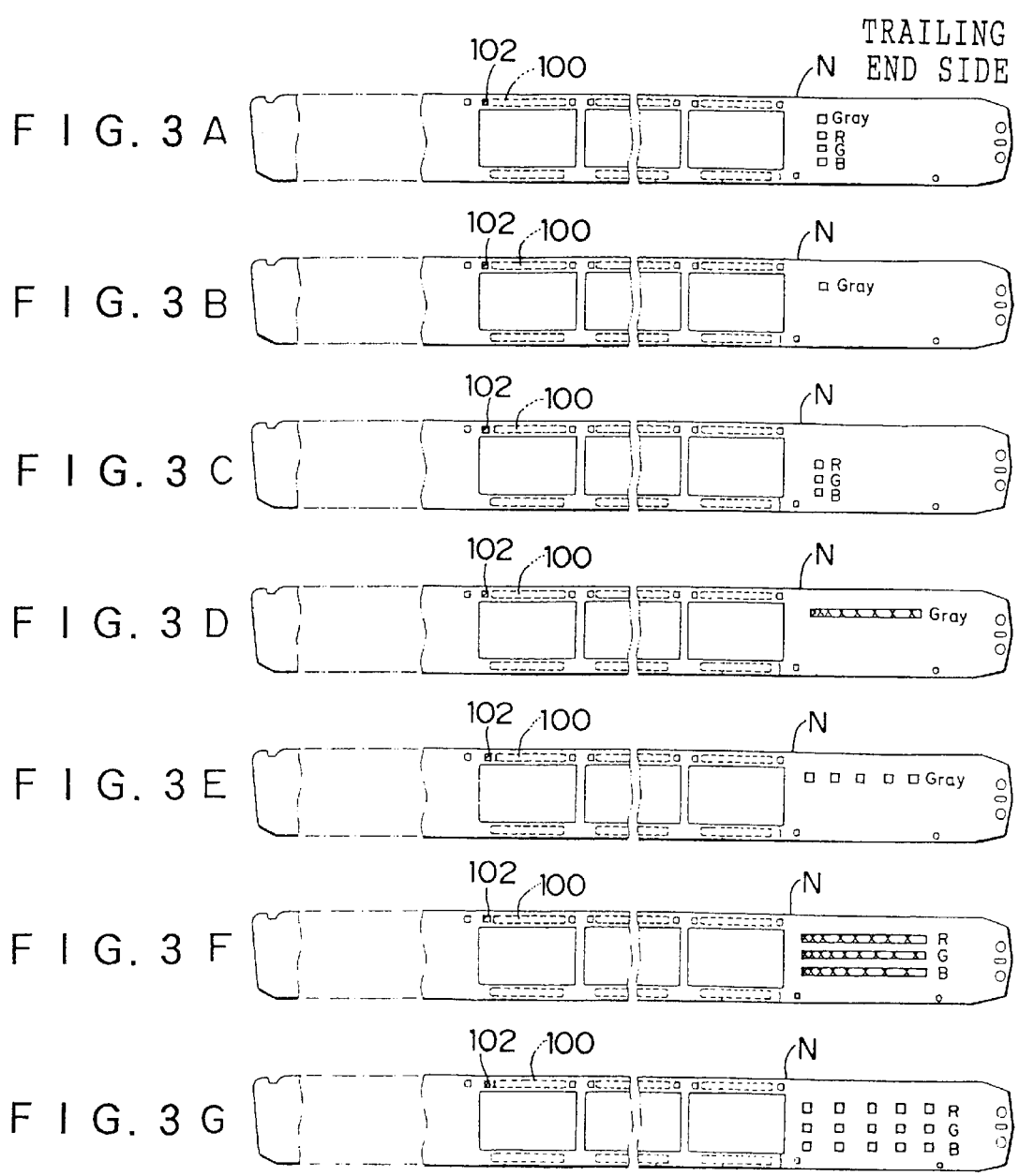
FIGS. 3A through 3G are plan views which show the patch images of calibration information provided on a film relating to the embodiment of the present invention.

Further, the film N corresponds to an APS (advanced photo system). As shown in FIG. 3, the film N is removable from the cartridge 20. When the film N is withdrawn from the cartridge 20 and the trailing end thereof appears, the film N is separated from the cartridge 20 by a dedicated removing device (unillustrated).

Moreover, a magnetic recording layer 100 is provided at the film N, and information which specifies each of the photographed image frames, e.g., a frame number or the like, is recorded in advance onto the magnetic recording layer 100. Also, a pair of perforations 102 are provided at every image frame.

Furthermore, a pattern serving as calibration information is recorded onto the trailing end portion of the film N. The calibration pattern is a monochromatic circular/rectangular image (patch image) of gray or the respective colors R, G, B. In the present embodiment, as shown in FIG. 3A, respective halftone single dots (e.g., in the case of 256 gradations, an image corresponding to the density of 128 gradations) are provided (a total of four dots). As the patch image, various configurations are possible in accordance with the characteristics of the films to be used: only one dot in a gray image (see FIG. 3B); three dots in images of colors R, G, B (see FIG. 3C); a gradation or a plurality of dots in a gray image (see FIG. 3D or 3E); and gradations or a plurality of dots in images of colors R, G, B (see FIG. 3F or 3G).

Regarding gradation exposure, if a light source, e.g., a laser beam or the like, which can be modulated is used, the density can be changed successively and gradually.

The calibration information patch image is print exposed under the same reference exposure amount conditions as are applied in the later photographic printing processing.

The calibration information patch image is provided at the trailing end portion of the film N because the trailing end portion is at a position which is least exposed and does not affect the photographic area. Therefore, the patch image may be provided at the leading end of the film N or the base portion around the image frame as long as it is placed at a position which is not exposed and does not affect the photographic area.

The position and the exposure configuration of the calibration information patch image is recorded onto the magnetic recording layer 100.

A water application portion 24 serving as application means is provided further downstream in the conveying direction of the film N than the cartridge loading portion 18 (the conveying roller pair 22).

The water application portion 24 is provided with an application tank 26. The application tank 26 is formed dish-shaped and filled with water serving as image forming solvent. Further, a supply roller pair 28 is disposed at the end portion of the application tank 26 at the upstream side in the conveying direction of the film N, and still further, a squeeze roller pair 30 is disposed at the end portion thereof at the downstream side in the conveying direction of the film N. Accordingly, in a state in which the application tank 26 is filled with water, the water is applied to the film N conveyed by the supply roller pair 28, and further, excess water is removed therefrom as the film N is nipped and conveyed by the squeeze roller pair 30.

A replenishing tank 32 is disposed beneath the application tank 26. The replenishing tank 32 is filled with water serving as image forming solvent and is connected to the application tank 26 via pipes 34, a pump 36, and the like. In this way, the water inside the replenishing tank 32 can be supplied to the application tank 26 so as to fill it, and the water inside the application tank 26 can also be discharged (returned) to the replenishing tank 32.

A heating drum 38 is disposed near the water application portion 24 at the downstream side in the conveying direction of the film N. The heating drum 38 is rotatably supported on the main body 12 and is rotated by an unillustrated driving system. A halogen lamp 40 is accommodated within the heating drum 38 so that the temperature of the heating drum 38 can be raised.

In contrast, a processing member cassette 42 is loaded into in the main body 12 on the side of the heating drum 38, namely, on the opposite side to the cartridge loading portion 18. The processing member cassette 42 is formed box-shaped and is removably loaded into a slide holding portion 46 which is provided at the upper portion and the lower portion of the main body 12. Consequently, the processing member cassette 42 can be removed from the main body 12 in the extending direction of the slide holding portion 46.

Namely, a guide hole 62 is provided in the slide holding portion 46 which holds the processing member cassette 42, and a guide pin 64 provided fixedly in the main body 12 is inserted into the guide hole 62. In this way, in a state in which the processing member cassette 42 is held, the slide holding portion 46 can move slidingly within the main body 12 in the directions of moving closer to and away from the heating drum 38. Moreover, in the slide holding portion 46, a rack 66 is formed in the vicinity of the guide hole 62, and a pinion 68 provided at the main body 12 engages with the rack 66. As a result, as the pinion 68 is rotated by the driving of an unillustrated motor, the slide holding portion 46, i.e., the processing member cassette 42, can slidingly move in the directions of moving closer to and away from the heating drum 38.

A processing member roll 48, a take-up roller 50, and winding rollers 52 and 54 are supported at an opposing gap between a pair of holding plates 44 of the processing member cassette 42. The winding roller 52 is urged by a spring 56 and serves as a pressure-applying roller when the film N is nipped between the heating drum 38 and a processing sheet 58, which will be described later.

The processing sheet 58 serving as a processing member is taken up onto the processing member roll 48 in a roll form and accommodated. The processing sheet 58 has a layer containing mordant for developing the film N on the substrate. The processing sheet 58 is fed from the processing member roll 48 and taken up onto the take-up rollers 52 and 54. Thereafter, the leading end portion of the processing sheet 58 is engaged with the take-up roller 50.

A holding projection 60, which has a configuration corresponding to the curved state of the heating drum 38, is formed between the winding rollers 52 and 54 and the transverse direction end portions of the fed portion of the processing sheet 58 are held in a predetermined curved state.

In a state in which the processing member cassette 42, which has been held in the slide holding portion 46, approaches the heating drum 38, the fed portion of the processing sheet 58, which has been fed from the processing member roll 48 and provided between the winding rollers 52 and 54, presses and contacts the outer circumference of the heating drum 38. Accordingly, in this state, the film N, which has been conveyed out of the water application portion 24, can be nipped and conveyed between the heating drum 38 and the fed portion of the processing sheet 58.

Since the film N is heated in a state in which the film N and the processing sheet 58 are laminated, due to the reaction with the mordant contained in the processing sheet 58, the diffusible dye is discharged or diffused imagewisely from the color material contained in the film N and a portion or a whole of the diffusible dye is removed from the film N. In this way, a color image formed from at least three colors is formed on the film N.

An after image, in which the reacted mordant portion corresponds to the image density of the film N, remains on the processing sheet 58. Namely, a reversal image (i.e., positive image) of the image formed on the film N remains thereon.

On the other hand, a peeling pawl 70 is disposed in the vicinity of the upper portion of the heating drum 38. The peeling pawl 70 can peel the film N, which has been nipped and conveyed between the heating drum 38 and the processing sheet 58, from the heating drum 38.

Further, a plurality of conveying rollers 72 is provided in the vicinity of the peeling pawl 70. The film N, which has been peeled from the heating drum 38 by the peeling pawl 70, can be conveyed out of an ejection port 74 provided at the upper end corner portion of the main body 12.

An image reading device 104 is provided at the outer side of the main body 12 where the ejection port 74 is provided. The image reading device 104 contains an optical system component for digitally reading the image formed on the film N.

As shown in FIG. 4, in the image reading device 104, the film N is nipped by a roller pair 106 and conveyed to a reading portion 108. The reading portion 108 includes a light source 110 and a light diffusion plate 112 so as to illuminate light onto the film N in a state in which the light is similar to natural light. A condenser lens 114 and a CCD sensor 116 are disposed on the opposite side of the film N with respect to the side on which the light source 110 and the light diffusion plate 112 are disposed. As a result, light transmitted through the film N forms an image on the light receiving surface of the CCD sensor 116 by the condenser lens 114 and an image of each image frame is digitally read.

Moreover, the CCD sensor 116 reads a color density image serving as the aforementioned calibration information which is provided at the trailing end portion of the film N.

The film N, of which the frame image and the calibration information image have been read, is wound around and reversed by a reversal roller provided at the downstream side of the image reading portion 108 and is then discharged to the outer side of the image reading device 104 in a horizontal state.

An image processing section 118 is provided in the image reading device 104. The digital image (frame image and calibration image) data read by the CCD sensor 116 is conveyed to the image processing section 118.

A CPU 120 is provided in the image processing section 118. A magnetic head 122 provided on the downstream side of the roller pair 106 is connected to the CPU 120. The magnetic head 122 has a function of reading, from the magnetic recording layer 100 of the film N, information which specifies the image frame such as a frame number or the like.

The image data read by the CCD sensor 116 is input to a data sorting portion 124. The information which specifies the image frame from the magnetic head 122 is also input to the data sorting portion 124. In the data sorting portion 124, the image for every frame and the calibration information image are sorted, the frame image is sorted and conveyed to a frame memory 126, and the calibration information is sorted and conveyed to a correction value operating portion 128. The frame memory 126 can store the image data of at least one film, and when the image data of one frame is stored, the image data is conveyed to an image data converting portion 130.

On the other hand, the calibration information which has been input to the correction value operating portion 128 is compared with the reference data which is the same as that at the time of recording. The correction value for correcting the difference due to the comparison is operated and conveyed to the image data converting portion 130.

For example, in a case in which gray (halftone) is printed at the amount of light and time to be referenced so as to be subjected to print/exposure, and thereafter, the data of the gray image read by the CCD sensor 116 deviates from the halftone after the development processing, it is determined that the deviation is caused by the characteristics of the film N. Then, the correction value for solving the deviation is operated, and the frame image data, which has been conveyed from the frame memory 126 to the image data converting portion 130, is corrected.

A hard disk 132 is connected to the image data converting portion 130 so as to successively store the corrected image data for every frame. The hard disk 132 is controlled by the CPU 120 so that the stored image data can be read when necessary.

Next, the operation of the present embodiment will be explained.

In the photosensitive material processing apparatus 10 structured as described above, the processing sheet 58 is taken up and accommodated in a roll form beforehand on the processing member roll 48 in the processing member cassette 42. Further, the processing sheet 58 is fed from the processing member roll 48 and wound around the winding rollers 52 and 54, and thereafter, the leading end portion of the processing sheet 58 is engaged with the take-up roller 50. In this state, the processing member cassette 42 is loaded into the slide holding portion 46 of the main body 12.

In this case, even if the processing member cassette 42 is removed from the main body 12, the fed portion (between the winding rollers 52 and 54) of the processing sheet 58 is held in a predetermined curved state by the holding projection 60. Accordingly, when the processing member cassette 42 is attached to and removed from the main body 12, the processing sheet 58 will not slacken or tighten unnecessarily.

Next, an operator loads the cartridge 20 accommodating the film N, having an image recorded onto each of the frames, into the cartridge loading portion 18 of the photosensitive material processing apparatus 10 and operates an unillustrated start button. In this way, the heat development processing of the film N is started.

In this case, until the heating drum 38 reaches a predetermined temperature, the processing member cassette 42 (the slide holding portion 46) is separated from the heating drum 38 by the driving of the pinion 68. Therefore, the processing sheet 58 is prevented from being heated unnecessarily.

When the heating drum 38 reaches the predetermined temperature, the processing member cassette 42 (the slide holding portion 46) is moved closer to the heating drum 38 by the driving of the pinion 68. The fed portion of the processing sheet 58, which has been fed from the processing member roll 48 and disposed between the winding rollers 52 and 54, is pressed and contacted with the outer circumference of the heating drum 38 (the state shown in FIG. 1).

In this case, even if the processing sheet 58 (the processing member cassette 42) is separated from the outer circumference of the heating drum 38, the fed portion (between the winding rollers 52 and 54) of the processing sheet 58 is held in a predetermined curved state by the holding projection 60 in the same way as mentioned above. Accordingly, the processing sheet 58 will not slacken or tighten unnecessarily. Therefore, if the processing member cassette 42 is moved closer to the heating drum 38, the processing sheet 58 is reliably pressed and contacted by the heating drum 38.

Next, the withdrawal and conveyance of the film N is started and the film-N is withdrawn from the cartridge 20. The film N withdrawn from the cartridge 20 passes through the application tank 26 of the water application portion and water is applied to the film N.

The film N, to which the water has been applied, is introduced between the lower end portion of the heating drum 38 and the winding roller 52. Further, the film N is conveyed on the outer circumferential portion of the heating drum 38 clockwisely in FIG. 1 while the film N is nipped between the processing sheet 58, which has been trained around the winding roller 52, and the outer circumferential portion of the heating drum 38. At this time, the processing sheet 58 is conveyed at the conveying speed which is the same as that of the film N. Because water is applied to the film N, the film N and the processing sheet 58 are conveyed on the outer circumferential portion of the heating drum 38 in a state in which the film N and the processing sheet 58 are adhered with no clearance therebetween.

When the leading end of the film N reaches the heating range of the outer circumferential portion of the heating drum 38, the conveyance of the film N and the processing sheet 58 is temporarily stopped and the film N and the processing sheet 58 are heated for a predetermined time.

As the film N is heated in a state in which the film N and the processing sheet 58 are laminated, the diffusible dye is discharged or diffused imagewisely from the color material contained in the film N and a portion or the whole of the diffusible dye is removed from the film N. In this way, a color image having at least three colors is formed on the film N. As mentioned before, because the water is adhered to the film N, the above-described film N is subjected to heat development uniformly.

When the film N has been heated for a predetermined time, the conveyance of the film N and the processing sheet 58 is resumed.

When the film N and the processing sheet 58 are conveyed to the upper end portion of the heating drum 38 after the conveyance of the film N and the processing sheet 58 has resumed, the processing sheet 58 is separated from the film N as the processing sheet 58 is wound around the winding roller 54.

The separated processing sheet 58 is successively taken up onto the take-up roller 50 by the conveyance of the processing sheet 58 after separation.

On the other hand, the film N, which has reached the winding roller 54, is peeled from the heating drum 38 by the operation of the peeling pawl 70. The film N, which has been peeled from the heating drum 38, is conveyed to the ejection port 74 by the conveying rollers 72 and conveyed to the outer side of the main body 12 from the ejection port 74.

In this way, the film N is subjected to heat development processing. In the image reading device 104, the image is read digitally and the read image data is input to a digital printer or the like. Consequently, a photographic print of each of the frame images of the film N can be obtained.

when a photographic print is made, since the color density depends on the image formed on the film N, it is necessary to carry out color density correction. In this case, in conventional analog exposure, an image transmitted through the film is displayed on a monitor and adjusted substantially by visual determination, the amount of insertion of each of the color filters is determined, and the image is subjected to actual print processing. In case of digital image data, an image is displayed on the monitor before printing in the same way and visual determination is required.

However, in the present embodiment, since the correction is made in advance on the basis of the calibration information, printing can take place at the amount of exposure to be referenced. The procedure of the calibration will be explained hereinafter.

The patch image (one dot of gray and the respective colors R, G, B) for calibration information is printed and exposed in advance on the film N. The image is formed in the same way as the frame image by the above-described heat development processing.

In the image processing section 118 of the image reading device 104, the information from the magnetic head 122 is introduced into the CPU 120, and at the same time, the image data from the CCD sensor 116 is received by the data sorting portion 124.

When it is determined that the image data input to the data sorting portion 124 is a photographic frame image in accordance with the information from the magnetic head 122, the frame number is specified and transmitted to the frame memory 126.

In the present embodiment, because the calibration information is provided at the trailing end of the film N, the above-described photographic frame images are continuous. The image data of one film is recorded onto the frame memory 126.

In the magnetic head 122, if it is determined that the image read by the CCD sensor 116 is the calibration information patch image, the image is transmitted from the data sorting portion 124 to the correction value operating portion 128.

Figure 5:
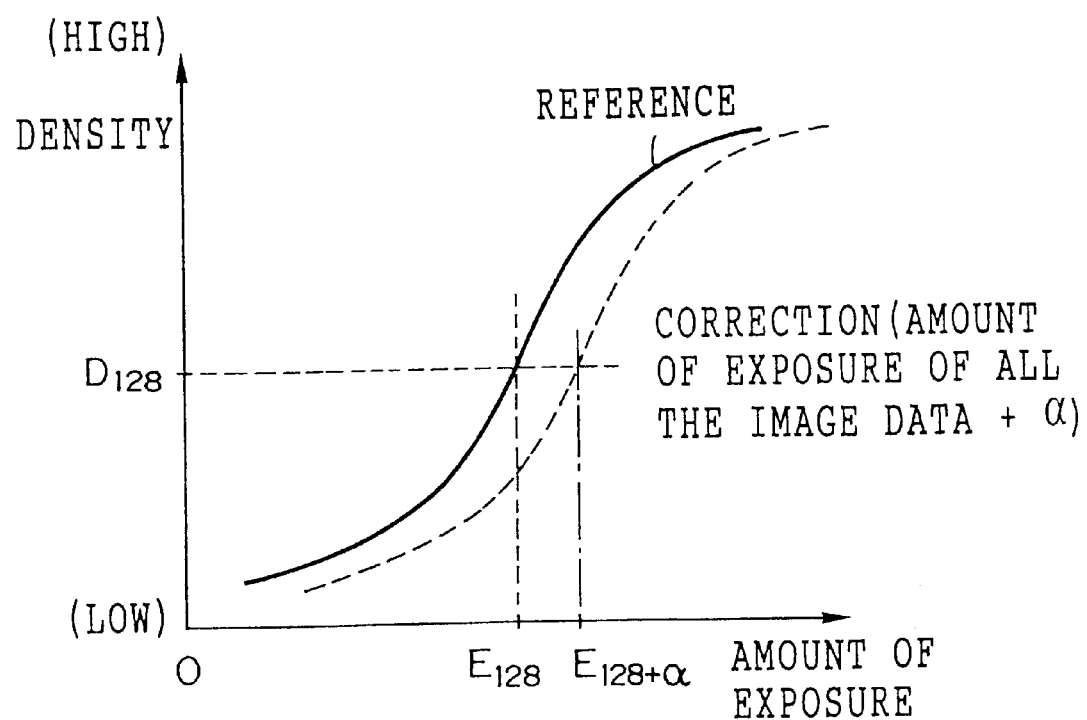
FIG. 5 is a characteristic view of the amount of exposure/density for obtaining a correction value by a one dot patch image of gray.

In the correction value operating portion 128, a γ curve based on the read patch image is compared with a curve (γ curve) of exposure to be referenced. Namely, if one dot of the patch image is recorded as calibration information, the inclination of the γ curve is the same as that of the curve of exposure to be referenced so that the γ curve is only shifted (if there is only a constant which does not affect the inclination of the characteristic). Consequently, as shown in FIG. 5, the correction is made by only adjusting the amount of shift (+α). The value is transmitted to the image data converting portion 130.

Further, if the characteristic of the γ curve is shifted with respect to all of the areas of the amount of exposure regardless of the correlation (see FIG. 6), the gradation (or a plurality of dots) of gray is exposed in advance as the calibration information (if there is a coefficient which affects the inclination of the characteristic), and a correction coefficient within each of the extremely narrow areas is determined.

The area is not set uniformly. It is desirable that the area, in which the inclination is flat and does not depend on the amount of exposure of the film N, is set wide and that the area, in which inclination is steep and does depend on the amount of exposure thereof, is set narrow. Further, when the inclination is non-linear (when there are various correction values for every gradations), an area is determined with predetermined restrictions, e.g., by restricting all of the processing times.

Figure 7:
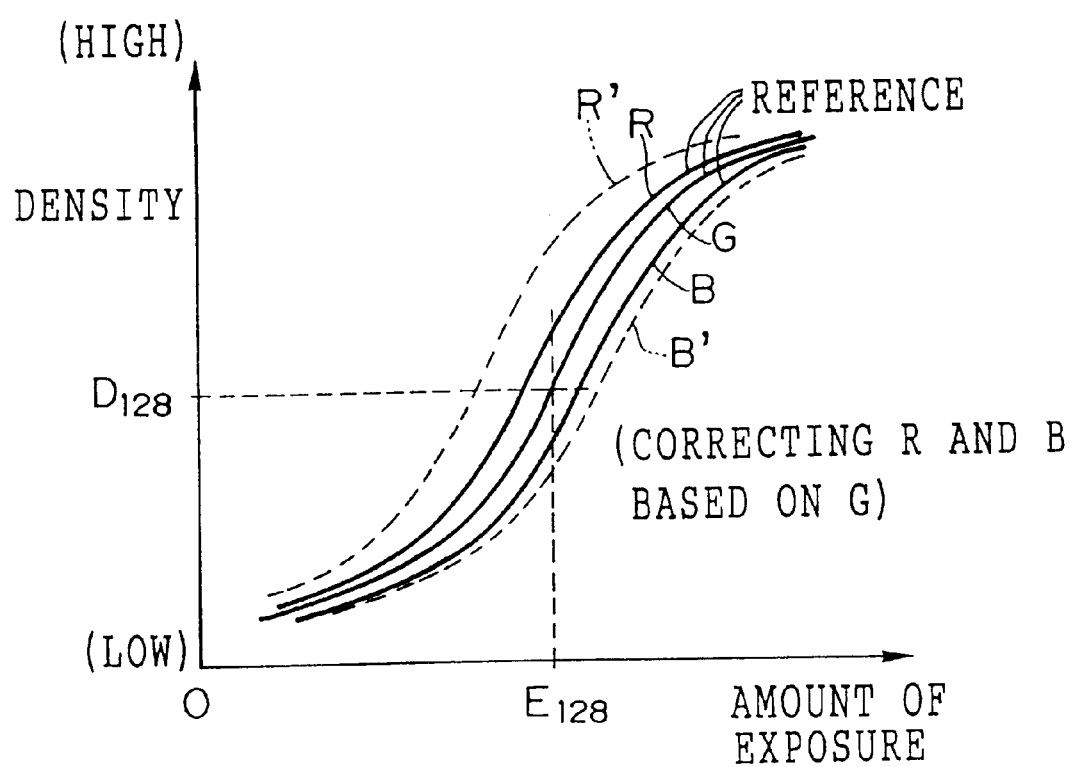
FIG. 7 is a characteristic view of the amount of exposure/density for obtaining a correction value by a one dot patch image of each of R, G, B.

Moreover, when the one dot image patch of each of the colors R, G, B is recorded as the calibration information due to the characteristics of the film N, [γ curves of the colors R, G, B are shifted from the curves of exposure to be referenced thereof (as an example, see R' and B' in FIG. 7)]. On the basis of a predetermined color (e.g., color G), the correction coefficients with respect to the amount of exposure of the other colors are determined and transmitted to the image data converting portion 130.

In the image data converting portion 130, the image data is read for every frame from the frame memory 126 and corrected on the basis of the correction value which has been transmitted from the correction value operating portion 128. The image data is then stored on the hard disk 132. By repeating this for every photographic frame, the corrected image data is stored in the hard disk 132.

In this way, in accordance with the present embodiment, since the image data is corrected before processing of the photographic print, the processing for correction of each image frame is not required and the operational efficiency improves.

In the present embodiment, the image serving as calibration information is print exposed in advance onto the trailing end of the film N. However, the print/exposure of the calibration information may take place when the film N is discharged from the cartridge loading portion 18 of the photosensitive material processing apparatus 10 of the present invention.

Further, it is possible that the image data stored in the frame memory 126 and the correction value data operated by the correction value operating portion 128 are separately recorded onto an exterior recording medium and that the recording medium is delivered to a customer. In this way, the customer can individually implement image processings such as the existence of correction, the degree of correction, and the like by using his/her personal computer or the like and can print a desirable image.

As described hereinbefore, the image processing method and the image reading method relating to the present invention has a superior effect in that, when the image is read for each photosensitive material for photographing under the same conditions, the digital image data which is suitable for the photosensitive material for photographing can be obtained by the simple calibration processing.

What is claimed is:

1. An image processing method, comprising the steps of:
   exposing a calibration pattern outside an image exposure area of a photosensitive material for photographing;
   exposing an image inside the image exposure area to form a continuous tone image;
   developing the exposed image and the exposed calibration pattern;
   digitally reading a formed image and the calibration pattern in substantially a same manner after development processing and creating digital image data and digital calibration pattern data; and
   using the created digital calibration pattern data, correcting the digital image data.

2. An image processing method according to claim 1, wherein when said photosensitive material for photographing is taken up in a roll form and accommodated within a predetermined cartridge, the exposure area of the calibration pattern of said photosensitive material for photographing is provided at an end portion which is close to a core of said cartrige.

3. An image processing method according to claim 1, wherein the calibration pattern is selected from a plurality of calibration patterns stored in advance by reading an identification marking which specifies the photosensitive material for photographing.

4. An image processing method according to claim 1, wherein the formed image data and the corrected image data are separately recorded onto an exterior recording medium.

5. An image processing method, comprising the steps of:
   exposing a calibration pattern outside an image exposure area of a photosensitive material for photographing;
   digitally reading a formed image and the calibration pattern after development processing in substantially a same manner and creating digital image data and digital calibration pattern data;

converting the created digital calibration pattern data into data which does not depend on the characteristic of said photosensitive material; and using the converted data, correcting the digital image data.

6. An image processing method according to claim 5, wherein said data which does not depend on the characteristic of the photosensitive material for photographing is an amount of exposure during photographing which is converted on the basis of the characteristic of the amount of photographing exposure/density.

7. An image processing method according to claim 6, wherein when a difference between characteristic of an amount of exposure/density of the photosensitive material to be applied and characteristic of an amount of exposure/density to be referenced is only a constant, which does not affect an inclination of the characteristics, at least one of a predetermined single gradation of gray or the respective colors R, G, B is exposed.

8. An image processing method according to claim 6, wherein when a difference between characteristic of an amount of exposure/density of the photosensitive material to be applied and characteristic of an amount of exposure/density to be referenced is a coefficient which affects an inclination of the characteristics, one of a predetermined plurality of gradations of gray or respective colors, R, G, B and a predetermined range of continuous gradations of gray or respective colors R, G, B is exposed.

9. An image processing method according to claim 8, wherein when the predetermined range of continuous gradations is exposed, the density is continuously changed by using a light source which can be modulated.

10. An image processing method according to claim 6, wherein if it cannot be determined whether a difference between characteristic of an amount of exposure/density of the photosensitive material to be applied and characteristic of an amount of exposure/density to be referenced is a coefficient which affects an inclination of the characteristics or a constant which does not affect the inclination thereof, one of a predetermined plurality of gradations of an arbitrary color and a predetermined range of continuous gradations of an arbitrary color is exposed.

11. An image processing method according to claim 10, wherein when the predetermined range of continuous gradations is exposed, the density is continuously changed by using a light source which can be modulated.

12. An image processing method according to claim 10, wherein when the correction coefficient of the digital image data is set for a plurality of areas, the area, in which the characteristic of the amount of exposure/density of the photosensitive material for photographing to be applied does not depend on the amount of exposure of the photosensitive material for photographing, is set wide and the area, in which the characteristic depend on the amount of exposure of the photosensitive material for photographing, is set narrow.

13. An image processing method according to claim 10, wherein when the correction coefficient of the digital image data is set for a plurality of areas, then when the characteristic of the amount of exposure/density of the photosensitive material for photographing to be applied is non-linear, an area is set with predetermined restrictions.

14. An image processing method according to claim 5, wherein said photosensitive material for photographing is taken up in a roll form and accommodated within a predetermined cartridge, the exposure area of the calibration pattern of said photosensitive material for photographing is provided at an end portion which is close to a core of said cartridge.

15. An image processing method according to claim 5, wherein the calibration pattern is selected from a plurality of calibration patterns stored in advance by reading an identification marking which specifies the photosensitive material for photographing.

16. An image processing method according to claim 5, wherein the formed image data and the corrected image data are separately recorded onto an exterior recording medium.

17. An image reading method, comprising the steps of:

exposing a calibration pattern outside the image exposure area of a photosensitive material for photographing, said exposing being performed one of before and after the image is exposed onto the photosensitive material for photographing;

digitally reading the formed image and the calibration pattern after development processing and creating digital image data and digital calibration pattern data; and adding the calibration pattern to said digital image data so as to be output.

18. An image reading method according to claim 17, wherein said photosensitive material for photographing is taken up in a roll form and accommodated within a predetermined cartridge, the exposure area of the calibration pattern of said photosensitive material for photographing is provided at an end portion which is close to a core of said cartridge.

19. An image reading method according to claim 17, wherein the calibration pattern is selected from a plurality of calibration patterns stored in advance by reading an identification marking which specifies the photosensitive material for photographing.

20. An image processing method, comprising the steps of:

exposing a calibration pattern outside an image exposure area of photosensitive material for photographing, said exposing being performed after an image is exposed inside the image exposure area of the photosensitive material;

developing the exposed image and the exposed calibration pattern;

digitally reading the developed image and the developed calibration pattern and creating digital image data and digital calibration pattern data; and using the created digital calibration pattern data, correcting the digital image data.

* * * * *